(12) United States Patent
Hackl

(10) Patent No.: US 10,151,790 B2
(45) Date of Patent: Dec. 11, 2018

(54) INSULATION FAULT LOCATING SYSTEM USING BRANCH-SELECTIVE FEEDING, AND SELECTIVE INSULATION FAULT MONITORING SYSTEM AND METHOD FOR DETERMINING A CROSS-CONNECTION IMPEDANCE BETWEEN TWO SUBSYSTEMS

(71) Applicant: Bender GmbH & Co. KG, Gruenberg (DE)

(72) Inventor: Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 705 days.

(21) Appl. No.: 14/487,177

(22) Filed: Sep. 16, 2014

(65) Prior Publication Data

US 2015/0077130 A1 Mar. 19, 2015

(30) Foreign Application Priority Data

Sep. 19, 2013 (DE) .................. 10 2013 218 836

(51) Int. Cl.
*G01R 31/14* (2006.01)
*G01R 19/00* (2006.01)
(Continued)

(52) U.S. Cl.
CPC ......... *G01R 31/14* (2013.01); *G01R 19/0092* (2013.01); *G01R 27/16* (2013.01);
(Continued)

(58) Field of Classification Search
None
See application file for complete search history.

(56) References Cited

U.S. PATENT DOCUMENTS 5,754,382 A * 5/1998 Aoyama ................ H02B 1/22
307/85
6,392,422 B1 * 5/2002 Kammer ............... H02H 1/06
324/509
(Continued)

FOREIGN PATENT DOCUMENTS

DE 1945803 A1 3/1971
DE 102004018918 B3 * 7/2005 ............. G01R 27/18
(Continued)

OTHER PUBLICATIONS

Hackl et al WO 2005/050229 "Method for Determining Ohmic Insulation Resistance" (English Machine Translation, Published Jun. 2, 2005).*

(Continued)

*Primary Examiner* — Vincent Q Nguyen
(74) *Attorney, Agent, or Firm* — King & Schickli, PLLC

(57) ABSTRACT

An insulation fault locating system using branch-selective feeding and a selective insulation monitoring system for a branched IT system is composed of multiple subsystems. For insulation fault location, a differential current measuring device, a test signal generator and a blocking device are arranged in each subsystem. The insulation monitoring device additionally includes a selective decoupling device arranged in each subsystem. Furthermore, a method determines a cross impedance between two subsystems on the basis of the insulation monitoring system.

13 Claims, 4 Drawing Sheets

(51) Int. Cl.
*G01R 27/16* (2006.01)
*G01R 27/18* (2006.01)
*H02H 3/33* (2006.01)
*G01R 31/44* (2006.01)
*H02H 7/26* (2006.01)

(52) U.S. Cl.
CPC ............ *G01R 27/18* (2013.01); *G01R 31/44* (2013.01); *H02H 3/334* (2013.01); *H02H 7/26* (2013.01)

(56) References Cited

U.S. PATENT DOCUMENTS

| | | | | |
|---|---|---|---|---|
| 2007/0229295 | A1* | 10/2007 | Curt | G01R 31/2829 340/653 |
| 2009/0254297 | A1* | 10/2009 | Bengtsson | G01R 27/16 702/117 |
| 2011/0148423 | A1* | 6/2011 | Richards | G01R 31/14 324/424 |
| 2011/0191034 | A1* | 8/2011 | Lee | G01R 31/343 702/35 |
| 2011/0227584 | A1* | 9/2011 | Beck | G01R 31/129 324/551 |
| 2012/0287544 | A1* | 11/2012 | Huang | H02H 3/025 361/93.6 |
| 2014/0097854 | A1 | 4/2014 | Hermeling et al. | |
| 2014/0153142 | A1* | 6/2014 | Callsen | G01R 31/025 324/510 |

FOREIGN PATENT DOCUMENTS

| | | |
|---|---|---|
| DE | 102010011476 A1 | 9/2011 |
| DE | 102011050590 A1 | 11/2012 |
| EP | 1593983 A1 | 11/2005 |
| EP | 1936393 A1 | 6/2008 |
| EP | 2530801 A1 | 12/2012 |
| WO | 2010069739 A1 | 6/2010 |

OTHER PUBLICATIONS

Hackl et al WO 2005/050229, "Method for Determining Ohmic Insulation Resistance" (hereinafter Hackl, English Machine Translation, Published Jun. 2, 2005).*
Baldwin T et al Analysis of fault locating signals for high-impedance grounded systems Conference Record of the 2001 IEEE Industry Applications Conference. 36th IAS Annual Meeting Chicago, IL, Sep. 30-Oct. 4, 2001; New York, NY : IEEE, US, Bd. 3, Sep. 30, 2001 (Sep. 30, 2001).
European Search Report EP 14 17 7467 dated Feb. 11, 2015.

* cited by examiner

State of the art

INSULATION FAULT LOCATING SYSTEM USING BRANCH-SELECTIVE FEEDING, AND SELECTIVE INSULATION FAULT MONITORING SYSTEM AND METHOD FOR DETERMINING A CROSS-CONNECTION IMPEDANCE BETWEEN TWO SUBSYSTEMS

This application claims the benefit of German Patent Application no. 10 2013 218 836.6 filed Sep. 19, 2013, the disclosure of which is incorporated herein by reference.

TECHNICAL FIELD

The invention relates to an insulation fault locating system for a branched IT system with a subsystem (subnetwork) and with a differential current measuring device arranged in the subsystem for registering a differential current measuring signal. Furthermore, the invention comprises an insulation monitoring system for monitoring an insulation resistance in a branched IT system with a subsystem and having the features of the insulation fault locating system and to a method for determining a cross-connection impedance between two subsystems in a branched IT system with the insulation monitoring system according to the invention.

BACKGROUND

To ensure high availability and operational safety of the electrical power supply and to guarantee personnel safety in the operator area of electrical installations, power supply networks are increasingly employed whose active components are separated from the earth potential. In this kind of power supply network, called IT system, an active conductor can present an insulation fault without the running operation of the installation having to be interrupted because no closed circuit can form in this first fault case owing to the ideally infinitely high impedance value between the conductor and earth. In this context, an insulation fault is understood to be a faulty state of the IT system which leads to a drop in the insulation resistance below the acceptable level of insulation. It becomes clear from this consideration that the resistance against earth in the network to be monitored (insulation resistance; also fault resistance in case of a fault) must be monitored constantly because a possible further fault in another active conductor (second fault) would cause a fault loop and the flowing fault current in connection with an overcurrent protection device would lead to a shutdown of the installation and to operational downtime. Actively measuring insulation monitoring devices known from the state of the art are connected between the network conductors and earth in the main branch of the IT system and superpose a measuring voltage on the network which leads to a current flow proportional to the insulation resistance. This measuring current causes a voltage drop at the measuring resistance of the insulation monitoring device, which is evaluated and results in a warning if a limit value, which can be preset, is exceeded.

In conjunction with continuous insulation monitoring, a fast and reliably executable localization and clearance of the insulation fault (insulation fault locating) is indispensible.

If an insulation fault occurs in an IT system, it is detected and reported by an insulation monitoring device. Upon this report, insulation fault location begins in that a test signal generator generates a test signal (test current) and, according to the state of the art, feeds it into the power supply system at a central point in the main branch. The test current flows through the live lines, the fault resistance and the earth lead back to the feeding point of the test current. This test current signal can be registered by all measuring current transformers in that circuit.

The objective in using an insulation fault locating system in branched IT systems is the most sensitive detection possible of insulation faults present in the subsystems and the identification of the subsystem with the largest insulation fault, i.e. the smallest insulation fault resistance. Since the test signal generator is virtually always designed to be current-limited, the test current is shared between all insulation fault resistances and network leakage capacitances present in the IT system. This means that the residual current flowing in a subnetwork is dependent not only on the size of the fault resistance in said subnetwork but also on other fault resistances and network leakage capacitances present in the IT system. The respective residual current measuring device in the subnetwork can safely detect insulation faults in the subnetwork to be monitored only starting from a minimum differential current determined by the resolution and the measuring error of the measuring system. Thus, the sensitivity of the insulation fault locating system is determined by the overall configuration of the IT system and can be negatively influenced.

In known designs of insulation fault locating systems, the test signal is additionally dependent on the nominal voltage of the IT system to be monitored. This, too, is another parameter that influences the sensitivity of the insulation fault locating system and increases the complexity of locating the insulation fault. Another particularity arises in insulation fault locating systems that feed pulse-shaped test signals, mainly in the form of a square-wave signal sequence, into the IT system. In this case, the transient effects due to scattered network leakage capacitances must be considered. The ratio of the network leakage capacitances upstream and downstream of the differential current measuring device in the subnetwork additionally determines the achievable sensitivity of the insulation fault locating device.

These deliberations show that the efficient use of an insulation fault locating system requires knowledge and consideration of the electrical parameters of the entire IT system. Knowledge of the cross-connection impedances, i.e. of the complex-value impedances carrying leakage current between the subsystems, would be advantageous.

The implementation of the insulation fault location, in particular in extensive, highly branched IT systems, is further complicated by the fact that there is not always a network configuration which allows for a sufficiently sensitive determination of insulation faults in the faulty subnetwork.

Apart from these difficulties in locating insulation faults, there is the problem in continuous insulation monitoring, too, that, according to the current state of the art, it is not possible to have the IT system actively monitored by more than one insulation monitoring device at a time. The active measuring systems of two or more active insulation monitoring devices in an IT system can influence one another in such a manner that the monitoring task is not reliably ensured. Since the conductance of the parallel circuit of all complex-valued insulation resistances in the entire system is always monitored, i.e. since the insulation monitoring device sees all network leakage capacitances present in the IT system, the measuring system of the insulation monitoring device has to be configured in such a manner that it can handle the interferences generated by the subsystems. In some applications, the selective monitoring of IT subsystems is required to be of such a design that an insulation fault in one IT subsystem is to lead to the quick shutdown of the affected subsystem without influencing other IT subsystems. So far, this requirement cannot be met by insulation monitoring systems according to the state of the art.

In cases where selective insulation monitoring is needed and in the required reaction to a critical second fault in the IT system, efforts are made to realize expedient solutions by using direction-selective differential current measuring technology and in a simple manner also by means of overcurrent triggers. These solutions, however, can be used reliably in IT systems only under certain configurations. In direction-selective differential current measuring technology, the ratio of the network leakage capacitances upstream of the summation current transformer and of the network leakage capacitances downstream of the summation current transformer is crucial for the direction-selective measurement to function reliably.

SUMMARY

Therefore, it is the object of the present invention to design an insulation fault locating device that allows fast and reliable detection of insulation faults in a branched IT system comprising multiple subsystems. Furthermore, it is the object of the invention to design an insulation monitoring device for a branched IT system which allows fast and reliable monitoring of the entire state of insulation of the IT system. Moreover, a method is desirable which, in addition to determining the insulation resistance, provides further information regarding the state of insulation of the IT system.

This object is attained, with respect to the insulation fault location, in connection with the preamble of claim 1 in that a test signal generator for serial feeding of a test signal is arranged in the subsystem and that the subsystem has a blocking device which limits the effectiveness of the test signal fed into said subsystem on said subsystem.

By separately providing a test signal generator and a blocking device for each subsystem and in connection with the differential current measuring device also being present in each subsystem, an insulation fault location can be carried out that is optimized for the respective subsystem. Thus, a fast and reliable detection of insulation faults is possible irrespective of the electrical state of the remaining IT system. The configuration of the insulation fault locating system with respect to measurement is thus designed in such a manner that the electrical characteristics of each system can be taken into account.

In contrast to the insulation fault locating systems known from the state of the art, the measuring and monitoring cycles in the insulation fault locating system according to the invention can be adapted to the respective subsystem and can be freely adjusted independent of the other subsystems. In critical subsystems, a test signal may be fed in shorter intervals and a very quick measurement is realized. In robust subsystems that have a low susceptibility to faults, larger test signal amplitudes could be worked with, for example; in sensitive subsystems, smaller test signal amplitudes could be advantageously selected.

The use of a blocking device and the accompanying encapsulation among the measuring devices in the subsystems advantageously leads to the adjustable measuring parameters and testing parameters, such as the test signal amplitude and the test signal frequency, being optimally adaptable to the conditions (network leakage capacitance, malfunctions) of the subsystem to be monitored without influencing the measuring task in other subsystems.

The blocking device thus prevents a feedback of the test signal optimized for the respective subsystem on the remaining IT system.

By means of the insulation fault locating system with branch-selective, serial feeding of a test signal separately into each subnetwork, a reliable and fast insulation fault location can take place in the entire system while the effectiveness of the fed test signal on the respective subnetwork is largely limited by the blocking device.

In another advantageous embodiment, the test signal generator is configured to generate test signals that have different signal shapes and adjustable signal parameters.

Each signal generator thus allows an individual generation and feeding of a test signal that is optimally suited specifically for the respective subsystem, said generation and feeding being adapted to the electrical properties of the respective subsystem. In this way, it is possible to design the test signal shape, other test signal parameters and the evaluation methods related thereto in an adjustable manner and freely select them so as to be able to realize a detection as robust as possible of the insulation faults in the entire IT system. Furthermore, this configuration of the test signal generator offers the possibility of sequentially switching to different test signals in order to accommodate other measuring and monitoring tasks. Multiple measurements with different test signals for selectively determining cross-connections carrying leakage current between two subsystems are to be mentioned by way of example.

In other embodiments, the test signal generator is configured as a sinusoidal signal generator or as a pulse signal generator.

For instance, as a function of the electrical characteristics, such as the network leakage capacitances of the IT system, and with regard to the expected interferences, feeding a sinusoidal test signal or a pulse-shaped test signal with respectively adapted test signal parameters may appear more suitable in order to be able to perform a measurement as free of errors as possible.

Advantageously, the blocking device has an adjustable selectivity which determines the strength of the limitation of the effectiveness of the test signal. By way of the adjustable test signal selectivity, it can be determined how strongly the test signal of the blocking device in a considered subsystem is to be decoupled from the remaining power supply network. This can take place, for example, via a change and pre-adjustment of the impedance of the blocking device effective with the test signal frequency.

The blocking device is preferably configured as a series resonant circuit. Based on the electrical properties of the IT system and on the expected interferences and thus as a function of the test signal shape, the blocking device is composed, in case of a sinusoidal test signal, of a passive series resonant circuit whose resonant frequency corresponds to the frequency of the fed-in test signal and which has the effect, by means of its minimal impedance determined by the ohmic resistance in the resonance case, that only a small portion of the test current leaks into the remaining "upstream" IT system.

In case of a pulse-shaped test signal, for example in form of a square-wave signal sequence, the blocking device is advantageously configured as a comb filter. The active comb filter causes a low-impedance connection to the earth potential for the respective test signal components of the respective subsystem and prevents the test signal from influencing the remaining IT system.

Furthermore, the feeding of the test signal is configured to be a serial feeding of a common-mode signal. The test signal is superposed with the same phase on all active conductors of the subnetwork.

With respect to insulation monitoring in a branched IT system composed of multiple subsystems, the object is attained in connection with the features of the insulation fault locating system according to claims 1 to 8 in that the subsystem has a selective decoupling device which, when an insulation fault occurs in a subsystem, decouples said subsystem from the remaining IT system with respect to measurement and thus prevents the measurements in the remaining IT system from being influenced.

Based on the mentioned features, the insulation fault locating system can be extended to form a selective insulation monitoring system. The test current, which is generated in the respective test current generator and is serially fed into the subsystem, can be configured as a measuring current for insulation monitoring. In contrast to the processing in known insulation monitoring devices, said measuring current is not measured at the measuring resistance of an insulation monitoring device, but is registered, like the above-mentioned test current, by means of the differential current measuring device of the respective subsystem.

The insulation monitoring system according to the invention comprises the decoupling device in addition to the features of the insulation fault locating system so that an insulation fault occurring in a subsystem does not influence the measurements in the remaining IT system.

This provision is necessary to prevent a disturbing influence on the measuring and monitoring tasks in the remaining network in particular in case of an insulation fault with a fault resistance close to zero Ohm (earth fault) in a subsystem. With respect to the measuring and monitoring task, the effect of the insulation fault is thus limited to the affected subsystem. With regard to the actual supply task, i.e. in case of an operating network frequency of the IT system to be monitored, the selective decoupling device must behave like a low line resistance so as to not inadmissibly influence the proper operation of the IT system, i.e. the energy supply of the affected branch, for example. With the aid of the selective decoupling device, it is possible, in case of a low-resistance insulation fault in one subsystem, to simultaneously monitor other present continuously high-resistance, fault-free subsystems.

A complete limitation of the influence of an insulation fault in a subsystem on the entire IT system, however, can only be achieved if the affected subsystem is specifically turned off in the fault case.

Through the design according to the invention including the selective decoupling device, the claimed insulation monitoring system can be used both in earthed and unearthed systems. Moreover, parallel insulation monitoring in different subsystems is possible.

The insulation monitoring system according to the invention can be optimally adapted to the conditions of the individual subsystem. If there are only low system leakage capacitances in one subsystem, for example, the insulation monitoring can produce results for this subsystem very quickly even if there are very high system leakage capacitances in other subsystems. The problem of a selectively acting insulation monitoring is thereby solved as well. Thus, a second fault can be safely detected.

In another advantageous embodiment, the selective decoupling device has an adjustable selectivity which determines the degree of decoupling.

Preferably, a sufficiently high-resistance impedance is generated for the test signals in the selective decoupling device. To largely prevent the measurements in the remaining IT system from being influenced when an insulation fault occurs in a subsystem, the faulty branch thus represents a high-resistance impedance for the test signals of the remaining network. Said impedance is adaptable, for example in terms of its frequency dependence, to the respective measuring and monitoring task. With the operating network frequency, as mentioned above, the decoupling device must be sufficiently low-resistance in order to not inadmissibly influence the proper operation of the entire IT system.

In another design, the decoupling device is preferably configured as a parallel resonant circuit if a sinusoidal test signal is fed in. This design allows a high-resistance impedance to be generated at exactly the resonance frequency of the parallel resonant circuit, which corresponds to the frequency of the fed-in sinusoidal test signal.

With respect to a method for determining a cross-connection impedance between two subsystems in a branched IT system with an insulation monitoring system according to the invention, the task is solved in that, in a sequential multiple measurement, the two subsystems are each supplied with the same test signal at the same setting of the selectivity of the blocking device and the decoupling device, then they are supplied with different test signals at different settings of the selectivity and the cross-connection impedance is determined from the difference of the measured insulation resistance values.

In a first step, two subsystems can initially be operated each with the same test signal and the same settings of the test signal selectivity of the blocking device and the decoupling device; in a second step, they can be operated with different test signals and different test signal selectivity, and in a third step, the cross-connection impedance can be determined from a comparison of the insulation resistance values measured in step one and two, wherein the sequence of the first two steps can be switched.

In case of the same test signal and the same test signal selectivity, i.e. in case of equal testing parameters for both subsystems, ohmic and capacitive cross-connections between the two subsystems are measured as well. If both subsystems of the IT system use the same test signals, test current components flow not only through potentially present leakage capacitances against earth but also through potentially present cross-connections between the two subsystems.

In case of different testing parameters, only the ohmic and capacitive connections against earth are determined owing to the good decoupling. The test signal components which are used in other subsystem are shielded for the considered subsystem so that cross-connections to other subsystems have little influence on the measurement of the insulation resistance in the considered subsystem.

The difference of the two measurements allows deducing the resistance value of the cross-connection.

Through this sequential multiple measurement with same and different test signals and corresponding settings of the (test signal) selectivity of the blocking devices and the decoupling device of the two subsystems, the complex-valued insulation resistance (leakage impedance) of the individual subsystems against earth and the cross-connection impedance between the considered subsystems can be determined.

BRIEF DESCRIPTION OF THE DRAWINGS

Other advantageous design features arise from the following description and the drawings, which illustrate a preferred embodiment of the invention by way of example. In the figures.

DETAILED DESCRIPTION

Figure 1:
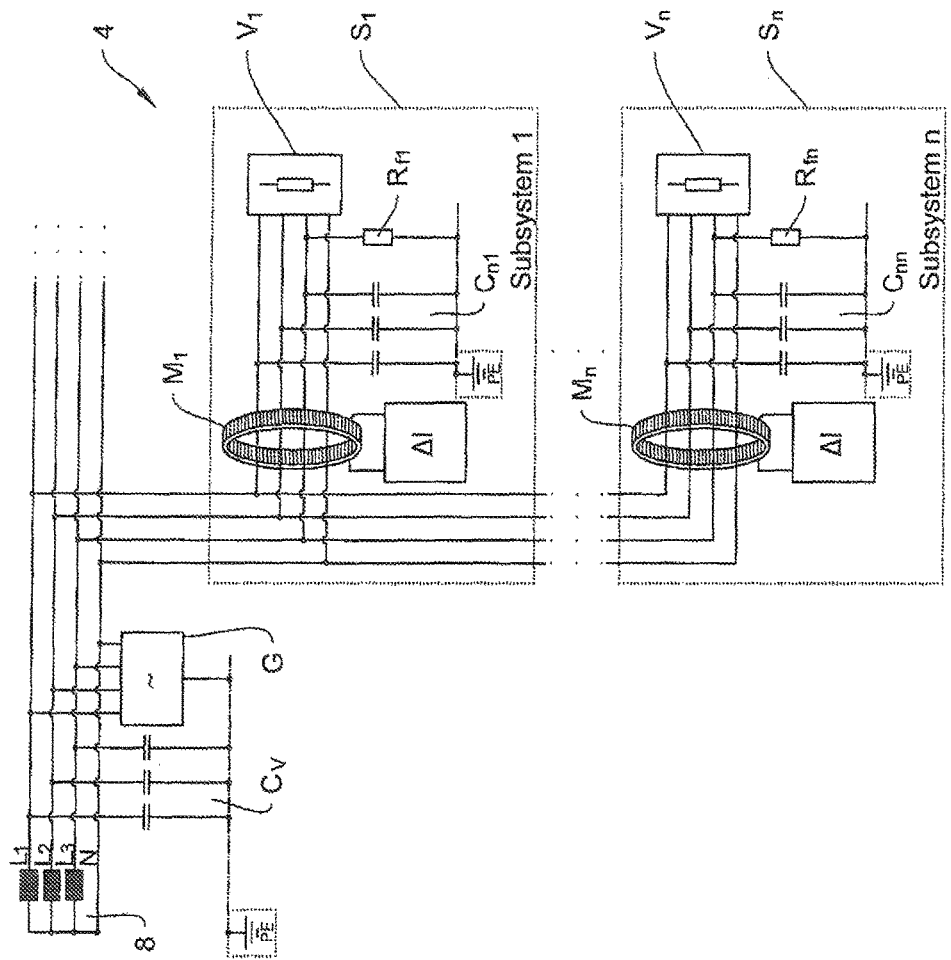
FIG. 1: shows an insulation fault locating system according to the state of the art.

FIG. 1 shows the structure of a typical insulation fault locating device corresponding to the state of the art for a branched IT system 4 with n subsystems (subnetworks) $S_1, \ldots, S_n$. By way of example, the IT system 4 is configured as a 3-phase power supply network with the outer conductors $L_1$, $L_2$, $L_3$, the neutral conductor N and the protective earth PE. The active conductors $L_1$, $L_2$, $L_3$ and N connect the power source 8 via a branched line system to the respective loads $V_1, \ldots, V_n$, in the individual subsystems $S_1, \ldots, S_n$. At a central position, a test signal generator G for feeding in a test signal is arranged in the main system. If an insulation fault with the fault resistance $R_{f1}, \ldots, R_{fn}$ occurs in a subsystem $S_1, \ldots, S_n$, the test signal in the faulty subsystem $S_1, \ldots, S_n$ is registered by a differential current measuring device $M_1, \ldots, M_n$ and can be subsequently assessed in a central evaluating unit.

The illustrated network configuration is further characterized by the system leakage capacitances $C_v$ and $C_{n1}, \ldots, C_{nm}$, wherein the distributed system leakage capacitances $C_v, C_{n1}, \ldots, C_{nm}$ here are described as concentrated elements which are arranged upstream ($C_v$) and downstream ($C_{n1}, \ldots, C_{nn}$) of the differential current measuring devices $M_1, \ldots, M_n$.

Figure 2:
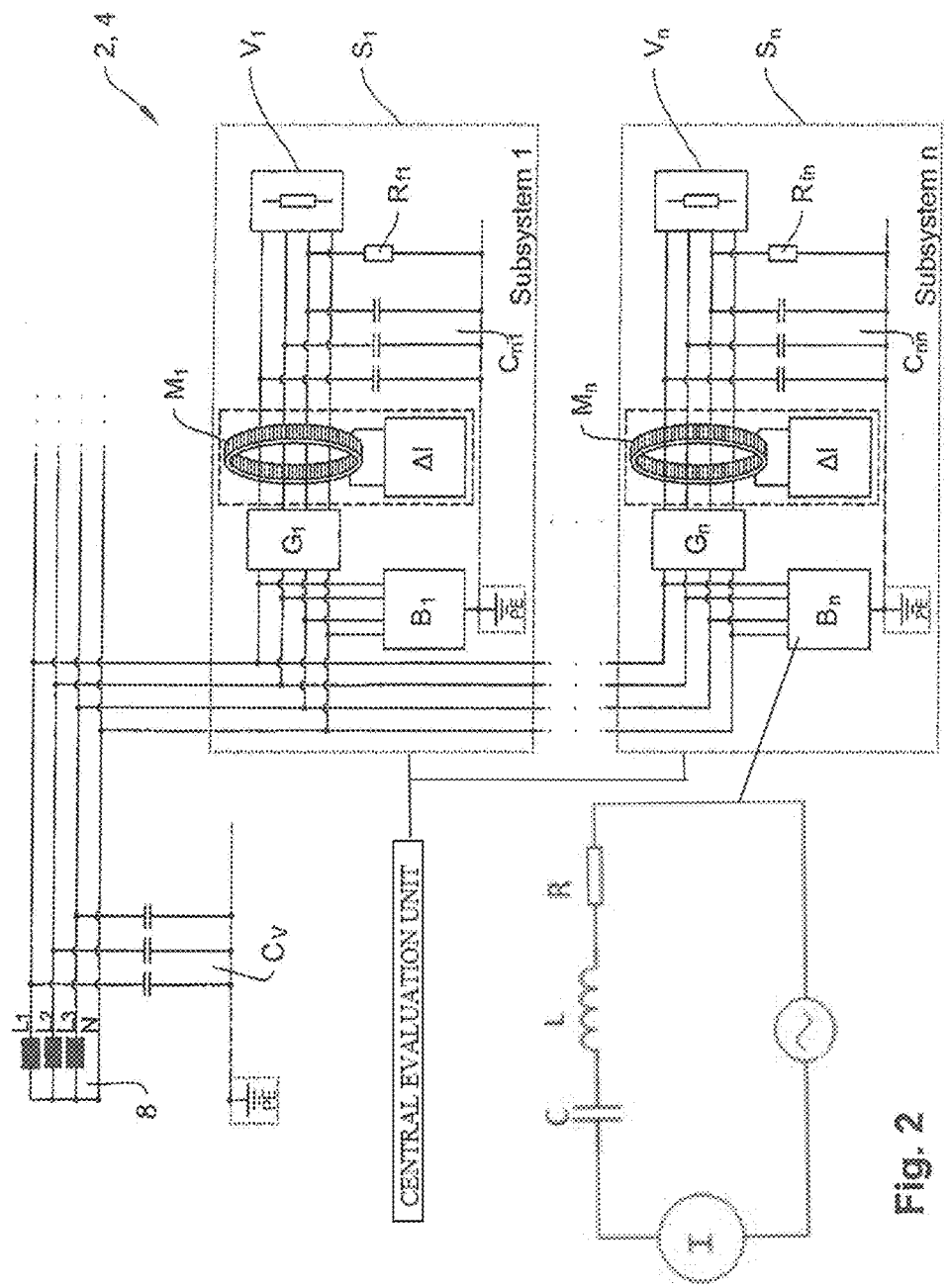
FIG. 2: shows an insulation fault locating system according to the invention with branch-selective feeding.

In FIG. 2, an insulation fault locating system 2 according to the invention with branch-selective feeding is illustrated. In contrast to the central feeding of the test signal in the insulation fault locating system according to the state of the art of FIG. 1, the insulation fault locating system 2 according to the invention has a test signal generator $G_1, \ldots, G_n$ for each subsystem $S_1, \ldots, S_n$ for serially feeding in a test signal that is individually adapted to the electrical parameters of the IT system 4, in particular to those of the respective subsystem $S_1, \ldots, S_n$. In the illustrated 3-phase power supply system 4, the test signal generator $G_1, \ldots, G_n$ serially feeds a common-mode test signal into each subnetwork phase. Said common-mode test signal can be a sinusoidal 1 V/1 kHz test signal or a pulse-shaped signal, for example.

In addition, each subsystem $S_1, \ldots, S_n$ comprises a blocking device $B_1, \ldots, B_n$ to prevent a backlash of the test signal fed into the respective subsystem $S_1, \ldots S_n$ onto the remaining IT system.

In case a sinusoidal 1 V/1 kHz test signal is fed in, the respective blocking device $B_1, \ldots, B_n$ is preferably realized as a series resonant circuit against earth with a resonance frequency of 1 kHz. Simulation results show that if the series resonant circuit is configured with an ohmic resistance of 100 mOhm and a modeling of the upstream system leakage capacitance of 20 µF, only approximately 1/80 of the 1 kHz test current flows from the subsystem $S_1, \ldots, S_n$ into the upstream network.

Furthermore, a differential current measuring device $M_1, \ldots, M_n$ suitable for detecting the test current is arranged in each subsystem $S_1, \ldots, S_n$.

Figure 3:
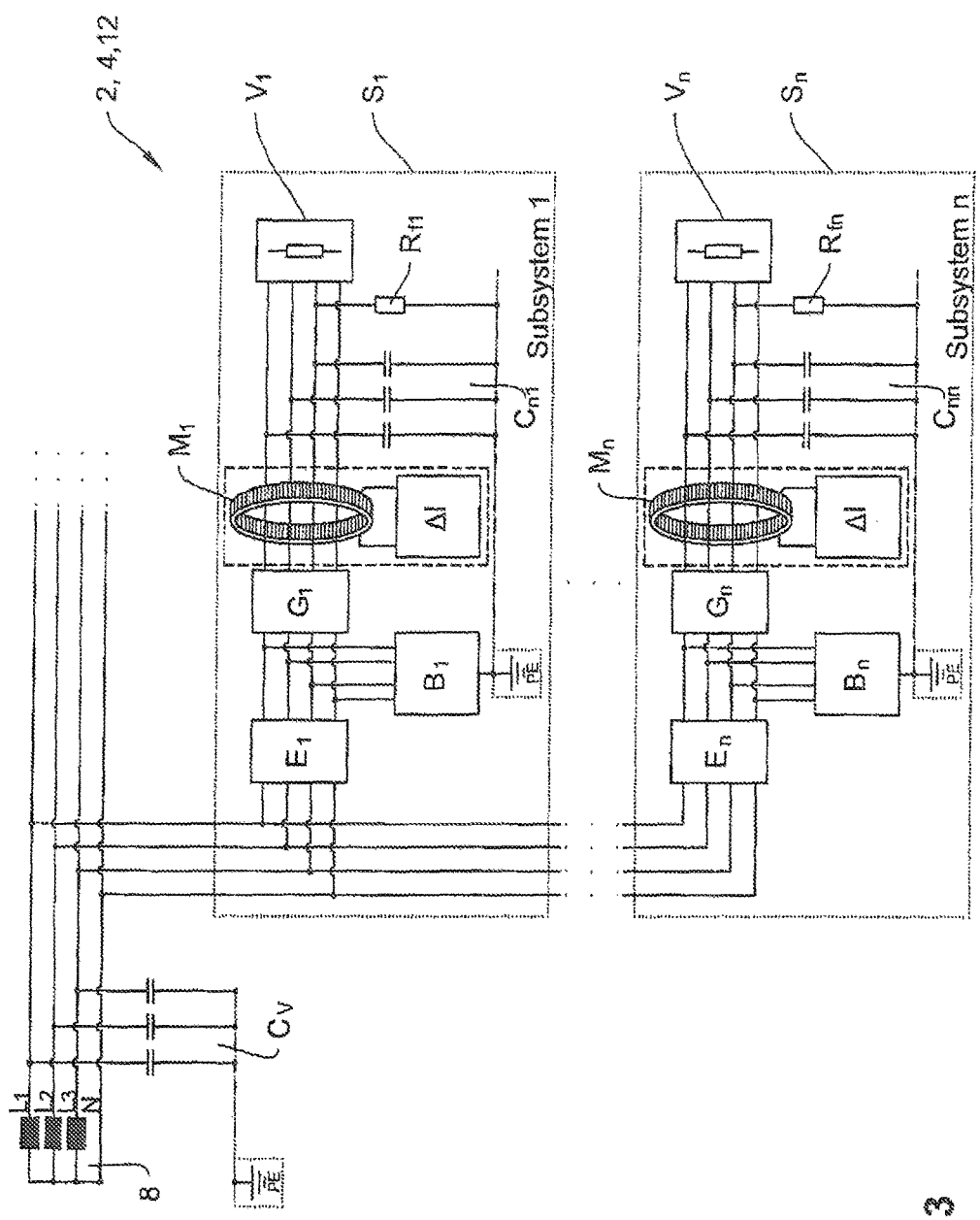
FIG. 3: shows a selective insulation monitoring system according to the invention

FIG. 3 shows the insulation fault locating system 2 illustrated in FIG. 2, which has been extended by a decoupling device $E_1, \ldots, E_n$ arranged in each subsystem $S_1, \ldots, S_n$ and which thus leads to the realization of a selective insulation monitoring system 12 according to the invention.

If a dead earth fault occurs in a subsystem $S_1, \ldots, S_n$, for example, i.e. if a subnetwork phase is connected to earth with negligible resistance, the encapsulation of the individual subnetworks $S_1, \ldots, S_n$ by means of the series resonant circuit of the blocking device $B_1, \ldots, B_n$, against earth as the only measure will no longer be sufficiently effective. In combination with the parallel resonant circuit from the decoupling device $E_1, \ldots, E_n$, however, the encapsulation of the faulty subnetwork $S_1, \ldots S_n$ is ensured even in this critical case.

This additional decoupling offers additional measurement reliability for insulation fault locating systems, but it is not fundamentally necessary.

To minimize the influence of the network-frequency energy transmission in the subnetwork $S_1, \ldots, S_n$ through the use of a decoupling device $E_1, \ldots, E_n$ in the form of a parallel resonant circuit, it is advantageous to use coupled inductances instead of single inductances. These "current-compensated chokes" offer a hardly effective inductance component for the network-frequency (differential-mode) load current, whereas the total inductance is effective for the test-signal-frequency (common-mode) measuring current.

Figure 4:
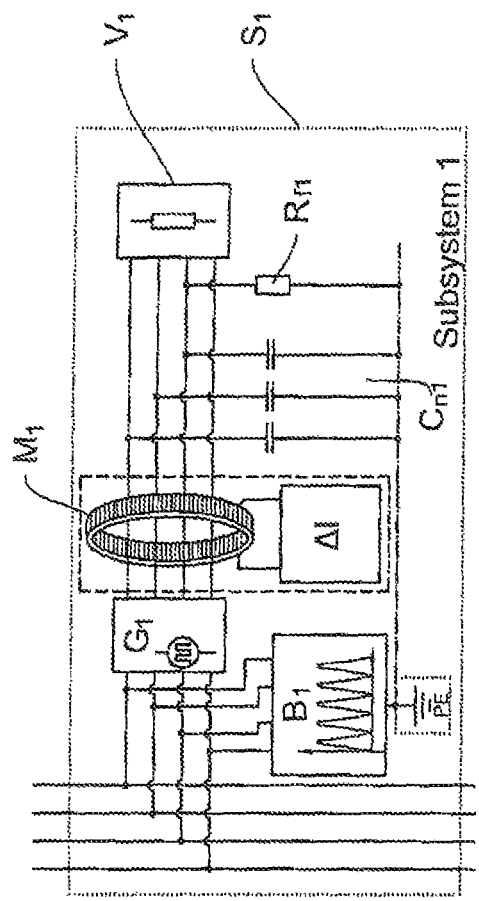
FIG. 4: shows an embodiment example of a subnetwork for pulse-shaped test signals.

FIG. 4 shows an embodiment example of a subnetwork $S_1, \ldots, S_n$ for pulse-shaped test signals. Instead of a passive series resonant circuit, the blocking device $B_1$ is configured as an active comb filter, which effects a low-resistance connection to the earth potential for the test signal components of the respective subsystem $S_1, \ldots, S_n$ only.

The invention claimed is:

1. An insulation fault locating system for a branched IT system associated with a central evaluation unit, with at least one subsystem, comprising a differential current measuring device arranged in each subsystem for outputting a differential current measuring signal indicating that a test signal is being detected, the differential current measuring signal being transmitted to the central evaluation unit for subsequent assessment, characterized in that a test signal generator for serial branch-selective feeding of the test signal is arranged in each subsystem and that each subsystem has a blocking device which limits the effectiveness of the test signal fed into said subsystem on said subsystem preventing feedback of the test signal on the remaining IT system.

2. The insulation fault locating system according to claim 1, characterized in that the test signal generator is configured to generate test signals that have different signal shapes and adjustable signal parameters.

3. The insulation fault locating system according to claim 1, characterized in that the test signal generator is configured to generate a sinusoidal test signal.

4. The insulation fault locating system according to claim 1, characterized in that the test signal generator is configured to generate a pulse-shaped test signal.

5. The insulation fault locating system according to claim 1, characterized in that the blocking device has an adjustable selectivity which determines the degree of limitation of the effectiveness of the test signal.

6. The insulation fault locating system according to claim 1, characterized in that the blocking device is configured as a series resonant circuit.

7. The insulation fault locating system according to claim 1, characterized in that the blocking device is configured as a comb filter.

8. The insulation fault locating system according to claim 1, characterized in that the feeding of the test signal is implemented as a serial feeding of a common-mode signal.

9. An insulation monitoring system for monitoring an insulation resistance in a branched IT system with at least one subsystem, having the features of an insulation fault locating system according to claim 1, characterized in that the subsystem has a selective decoupling device which decouples a subsystem from the remaining IT system with regard to the measuring test signal and which behaves low resistive with regard to an operational frequency in order to maintain the energy supply for said subsystem when an insulation fault occurs in said subsystem and thereby prevents the measurements in the remaining IT system from being influenced.

10. The insulation monitoring system according to claim 9, characterized in that the selective decoupling device has an adjustable selectivity which determines the degree of decoupling.

11. The insulation monitoring system according to claim 9, characterized in that the selective decoupling device presents a sufficiently high impedance for the test signals.

12. The insulation monitoring system according to claim 9, characterized in that the test signal generator is adapted to produce a sinusoidal test signal; and the decoupling device is configured as a parallel resonant circuit.

13. A method for determining a cross-connection impedance between two subsystems in a branched IT system with each of the two subsystems including a differential current measuring device for registering a differential current measuring signal, a test signal generator for serial branch-selective feeding of a test signal and a blocking device which limits the effectiveness of the test signal fed into each subsystem, a selective decoupling device which decouples each respective subsystem from the remaining IT system with regard to the measuring test signal and which behaves low resistive with regard to an operational frequency in order to maintain the energy supply for said subsystem when an insulation fault occurs in a respective subsystem and thereby prevents measurements in the remaining IT system from being influenced, characterized in that in a sequential multiple measurement, at first, each of the two subsystems is supplied with the same test signal, the same selectivity of the blocking device and of the decoupling device being set, then they are supplied with different test signals, a different selectivity being set, and the cross-connection impedance is determined from the difference of the measured insulation resistance values.

* * * * *